July 22, 1969 H. A. WAGGENER 3,457,148

PROCESS FOR PREPARATION OF STABILIZED METAL FILM RESISTORS

Filed Oct. 19, 1964 2 Sheets-Sheet 1

INVENTOR
H. A. WAGGENER
BY Edward M. Fink
ATTORNEY

July 22, 1969 H. A. WAGGENER 3,457,148

PROCESS FOR PREPARATION OF STABILIZED METAL FILM RESISTORS

Filed Oct. 19, 1964 2 Sheets-Sheet 2

United States Patent Office 3,457,148
Patented July 22, 1969

3,457,148

PROCESS FOR PREPARATION OF STABILIZED METAL FILM RESISTORS

Herbert A. Waggener, New Providence, N.J., assignor to Bell Telephone Laboratories, Incorporated, New York, N.Y., a corporation of New York Filed Oct. 19, 1964, Ser. No. 404,740
Int. Cl. C23b *9/02*
U.S. Cl. 204—56 4 Claims

ABSTRACT OF THE DISCLOSURE

Stabilized thin film resistors are obtained by formation of either an aluminum oxide or silicon oxide layer intermediate a deposited metal film and its anodic oxide layer.

This invention relates to a technique for the fabrication of stabilized metal film resistors.

In recent years, a widely used method for reducing the size of electrical apparatus has been the substitution of printed circuits for conventional wiring. Accordingly, a need has been created for precise and accurate procedures for the fabrication of printed circuit components such as resistors.

The earliest printed circuit resistors consisted of an array of parallel lines which were connected at alternate ends to form a continuous path, the configuration also including "shorting bars" which served to connect alternate lines, thereby shorting out the resistance of the line intermediate the two connected lines. Such resistors were designed to have a resistance lower than the desired value and adjustment was made by cutting through an appropriate number of shorting bars.

The next step in the development of printed circuit resistors is described in U.S. Patent 3,148,129 granted Sept. 4, 1964, wherein a film-forming metal is deposited upon a substrate in a configuration such that the resistance of the deposited layer is less than that ultimately desired. Subsequently, the deposited layer is anodized to convert a portion of the metal layer thickness to the oxide form, thereby increasing the resistance of the layer, anodization being continued until the resistance of the metal layer attains a desired value.

Although devices fabricated in accordance with the techniques described heretofore have proven satisfactory in most applications, resistance drift has been noted, particularly at elevated temperatures of the order of 400° C. and higher.

In accordance with the present invention, a technique is described for the fabrication of stabilized metal film resistors wherein resistance drift of the noted type is effectively arrested or retarded by the use of an additional oxide layer intermediate the deposited metal film and the anodic oxide layer. In alternative embodiments, this end is attained by producing the oxide material either on the resistive material or over the anodic oxide layer.

The invention will be more readily understood from the following detailed description taken in conjunction with the accompanying drawing wherein.

The present invention may conveniently be described in detail by reference to the following illustrative examples in which tantalum is employed as an exemplary film-forming metal and aluminum oxide is employed as an exemplary oxide material. It will be appreciated by those skilled in the art that the described sequence of steps is not critical and may be altered by one skilled in the art without departing from the spirit and scope of the invention.

Figure 1:
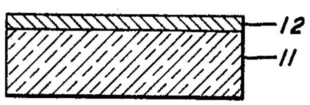
FIG. 1 is a cross-sectional view of a substrate with a layer of tantalum, an examplary film-forming metal deposited thereon.

With further reference now to FIG. 1, there is shown a substrate 11 upon which a metallic pattern is to be produced in accordance with the present invention. The first step in the inventive technique comprises cleansing the substrate, such end being attained by any conventional means. Following a thin layer of tantalium 12, a film-forming metal which is reactive with its oxide form, is deposited upon substrate 11 by cathodic sputtering or vacuum evaporation techniques as described by L. Holland in "Vacuum Deposition of Thin Films," J. Wiley & Sons, 1956. The film-forming metals which are of interest for use in the described process are tantalum and niobium, both of which react with their oxides.

In general, the thickness of layer 12 is not critical except as governed by the design value of the resistor being prepared. For the purposes discussed herein, such layers are preferably within the range of 500 to 2500 angstroms. However, it will be appreciated by those skilled in the art that such limits are not absolute and variations may be made within the scope of the invention.

Figure 2:
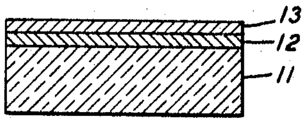
FIG. 2 is a cross-sectional view of the body of FIG. 1 after the deposition thereon of a layer of a contact material from which two terminals may be fabricated.

In one embodiment of the invention, the next step (depicted in FIG. 2) comprises depositing a layer of a suitable contact material 13 from which two terminals may be fabricated in a subsequent stage of the processing. Any of the conventional contact materials are suitable for this purpose, Nichrome-gold films being of particular interest in this use.

Figure 3:
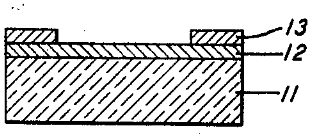
FIG. 3 is a cross-sectional view of the body of FIG. 2 after photoengraving and etching to form a pattern of two terminals of the contact material.

Following, a patterning of two terminals is formed in layer 13 by photoengraving and etching of that layer so as to remove certain portions thereof. Any of the well-known conventional photoengraving procedures may be used to effect this result. (See "Photoengraving," Groesbeck, Doubleday Page Co., 1924.) The body of FIG. 2 after this photoengraving step is shown in FIG. 3.

Figure 4:
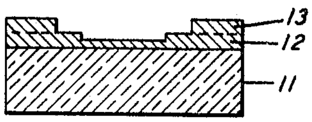
FIG. 4 is a cross-sectional view of the body of FIG. 3 after photoengraving and etching to form a desired resistor pattern.

Thereafter, the body of FIG. 3 is again subjected to a photoengraving and etching step whereby certain portions of layer 12 are removed, so resulting in a desired resistor pattern (shown in FIG. 4).

Figure 5:
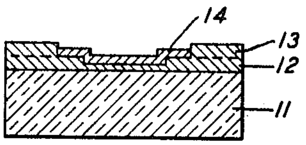
FIG. 5 is a cross-sectional view of the body of FIG. 4 after the deposition of a layer of aluminum upon the resistor pattern.

Following the photoengraving step, a layer of aluminum 14 is deposited upon the resistor pattern shown in FIG. 4, so resulting in the body shown in FIG. 5. This material may be deposited by cathodic sputtering or vacuum evaporation techniques and for the purpose of illustration is aluminum. However, silicon is also of particular interest for this use. It will also be appreciated by those skilled in the art that aluminum oxide may, in certain cases, be deposited directly upon the resistive material, as, for example, by reactive sputtering.

Figure 6:
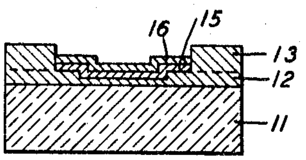
FIG. 6 is a cross-sectional view of the body of FIG. 5 after anodization.
Figure 7:
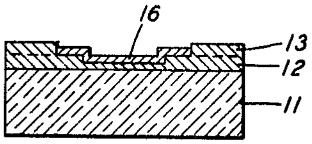
FIG. 7 is a cross-sectional view of the body of FIG. 4 after anodization.

Next, the body of FIG. 5 having aluminum layer 14 exposed is anodized by conventional techniques, thereby resulting in the structure of FIG. 6 having a layer of aluminum oxide 15 underlying a film of tantalum pentoxide.

The final step in the process involves thermally preaging the resultant structure by the technique disclosed in copending application, Ser. No. 74,691 filed Dec. 8, 1960, now U.S. Patent 3,159,556.

For clarity of exposition of the design, the pattern shown in FIG. 6 has been greatly simplified and it is to be appreciated that there is virtually no limit on the intricacy or detail of design which may be produced.

In an alternative embodiment, the aluminum layer 14 may be deposited upon the resistor pattern of FIG. 4 after anodization of layer 12.

Figure 8:
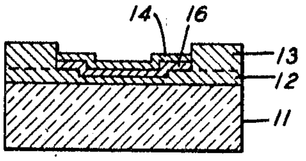
FIG. 8 is a cross-sectional view of the body of FIG. 7 after the deposition thereon of a layer of aluminum.
Figure 9:
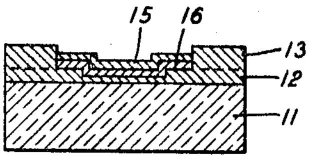
FIG. 9 is a cross-sectional view of the body of FIG. 8 after further anodization.

Thus, as shown in FIG. 6, the body of FIG. 4 is first anodized, so resulting in a layer of tantalum pentoxide 16 upon the resistor pattern. Thereafter, a layer of aluminum 14 is deposited upon oxide layer 16 (shown in FIG. 8) and the resultant assembly anodized, thereby resulting in a film of tantalum oxide 16 overlying aluminum oxide layer 15 (shown in FIG. 9).

Several examples of the present invention are described in detail below. The examples are intended merely as being illustrative of the present invention, and it is to be appreciated that the described procedure may be varied by one skilled in the art without departing from the spirit and scope of the present invention.

Example I

This example describes the fabrication of a plurality of resistors wherein a pattern of tantalum was deposited by cathodic sputtering upon 1" x 3" glass microscope slides.

The first step in the process involves cleansing the substrate members by inserting them in a Nichrome wire basket and following the schedule set forth below: (a) suspend basket in tank containing a solution of "Igepol" in distilled water and clean ultrasonically at room temperature for 5 minutes; (b) suspend basket in second tank containing a solution of "Igepol" in distilled water and clean ultrasonically for 5 minutes at 75° C.; (c) rinse substrate members with hot tap water for 10 minutes; (d) boil in 10 percent solution of $H_2O_2$ for 10 minutes; (e) rinse for 30 seconds with hot distilled water; (f) soak for 15 minutes in boiling deionized water; (g) place basket in nitrogen dryer for 15 minutes.

Following the cleansing procedure, the substrate members were loaded upon a substrate carrier and the resultant assembly positioned within a conventional cathodic sputtering apparatus. Thereafter, the substrate carrier was heated to 250° C. and the system evacuated to a pressure of $2.0\times10^{-6}$ torr. Next, argon was admitted until a pressure of $12\mu$ of mrecury was obtained. Sputtering was then initiated by impressing a difference of potential of 4500 volts between the anode and tantalum cathode of the sputtering apparatus, sputtering being continued for 5 minutes, so resulting in a tantalum film having a thickness of approximately 725 angstroms.

After removing the substrates from the sputtering apparatus, one-half were set aside to await further processing and the remainder positioned within a vacuum evaporation apparatus. The evaporation system was then evacuated to a pressure of $1.3\times10^{-5}$ torr, the substrates being heated to approximately 250° C. Then, approximately 200 angstroms of aluminum were deposited upon the sputtered tantalum films from an electrically heated tungsten filament bearing an aluminum wire.

Thereafter, both groups of susbstrates were partially masked with grease and the unmasked portions anodized in a solution of 30 percent ammonium pentaborate in ethylene glycol at a current density of 1 milliampere per square centimeter. Anodization was continued until the potential across the anodization cell rose to 45 volts.

Next, the anodized assemblies were photoengraved and etched by conventional techniques well known to those skilled in the art. Subsequent to etching, the resultant assemblies were again anodized in the manner described above, anodization being continued until each of the units evidenced a resistance value within the range of 4500–5000 ohms.

Next, the grease was removed and Nichrome-gold terminations deposited in its place upon the resistor ends through a metal mask. Finally, the resultant resistors were thermally preaged by heating at 250° C. for 5 hours.

Figure 10:
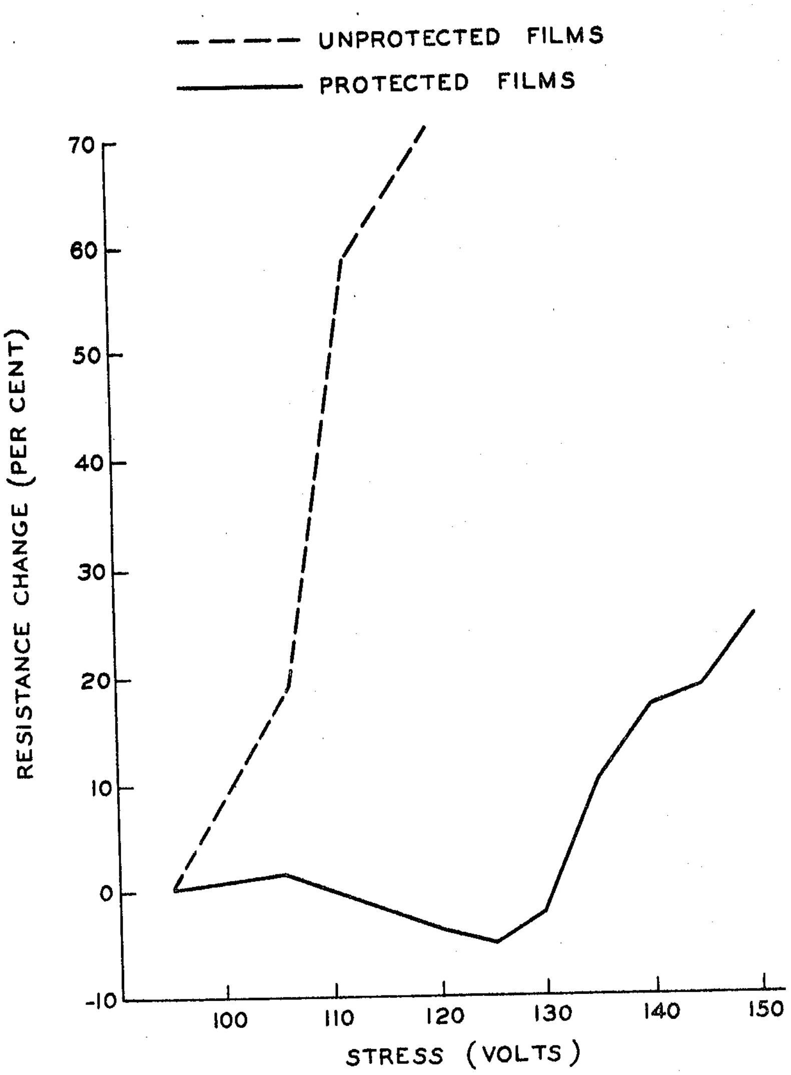
FIG. 10 is a graphical representation on coordinates of resistance change in percent against voltage stress in volts showing the resistance change with accelerated power aging of devices fabricated in accordance with the present invention and by prior art techniques.

In order to demonstrate the superiority of the inventive technique over prior art procedures, step stress power aging was conducted on both sets of resistors, that is, those bearing the protective coating of aluminum oxide and those which were unprotected. The step stress aging was conducted by connecting the resistors in parallel to a constant voltage power supply, voltages being chosen so as to increase the power in ¼ watt steps. Each voltage step was applied for 15 minutes and the resistors were permitted to cool for 15 minutes before measurements were made. The results of these tests have been shown in FIG. 10 which is a graphical representation on coordinates of resistance change in percent against stress in volts. It is apparent by reference to FIG. 10 that the resistors prepared in accordance with the present invention are significantly more stable than those lacking the protective aluminum oxide layer.

Example II

This example describes the fabrication of a plurality of tantalum nitride film resistors.

The first step involved cleansing the glass substrate members of the type described in Example I by the procedure outlined above. Next, the cleansed substrates were loaded upon a substrate carrier and positioned in a conventional sputtering apparatus. Following, the substrate carrier was heated to 400° C. and the system evacuated to a pressure of $4\times10^{-6}$ torr. Nitrogen was then admitted to the system until a partial pressure of $6\times10^{-6}$ torr was attained and the pressure gradually increased to $12\mu$ of mercury with argon. Sputtering was then initiated by impressing a difference of potential of 4500 volts across the anode and tantalum cathode. During the first 30 minutes of sputtering a protective shield was used to cover the substrate members. Next, the shield was removed and sputtering continued until the sheet resistivity of the resultant film reached 30 ohms/square. The system was then permitted to cool to 35° C. and the substrates removed.

Then, the substrates were positioned within a vacuum evaporation apparatus and the system evacuated to $5\times10^{-5}$ torr. The substrates were then heated for 20 minutes and Nichrome-gold films deposited on the tantalum nitride films by conventional vacuum evaporation techniques. Next, the resultant Nichrome-gold films were photoengraved and etched, so resulting in the desired termination pattern. Thereafter, the desired resistor pattern was obtained by photoengraving and etching the tantalum nitride film.

Following, a film of aluminum 200 angstroms in thickness was deposited upon one-half of the resistor patterns by vacuum evaporation techniques, the remainder being set aside to wait further processing.

Then, both groups of resistors were anodized in a solution of 30 percent ammonium pentaborate in ethylene glycol, so resulting in restistors evidencing a resistance value of approximately 8500 ohms. Finally, the resistors were thermally preaged by heating in an oven at 250° C. for 5 hours.

The substrates were next cut so that some resistors could be heated in air and some in vacuo. One group was positioned within a preheated forced air oven and maintained at 550° C. for 30 minutes. The other group was sealed in glass tubes which were evacuated to a pressure of $5.0 \times 10^{-7}$ mm. Hg. The sealed tubes were then placed in the oven and treated in the same manner as the companion group. The average change in resistance for resistors of both groups in shown in the table. It is again apparent by reference to the table that superior stability is attained by the use of the protective oxide layer.

TABLE.—RELATIVE RESISTANCE CHANGES ON HEATING AT 550° C. FOR 30 MINUTES

| | Resistance change | | | |
|---|---|---|---|---|
| | Unprotected | | Protected | |
| Test conditions | Percent change | No. of samples | Percent change | No. of samples |
| Air at atmospheric pressure | 378±61 | 12 | 29±19 | 10 |
| Air at $5.0 \times 10^{-7}$ mm. Hg | 33±2 | 10 | 5±4 | 8 |

Example III

The procedure of Example II was repeated with the exception that the substrates were anodized in a solution of 0.01 percent citric acid prior to deposition of the aluminum film. All the assemblies prepared as described were then heated in a forced air oven at 550° C. for 30 minutes. Eight samples averaged 35 percent change in resistance under these conditions as compared with an average change in resistance of several hundred percent for resistors lacking the aluminum oxide protective layer.

What is claimed is:

1. A method for the fabrication of a metal film resistor which comprises the step of depositing a layer of a film-forming metal selected from the group consisting of tantalum and niobium upon a substrate by condensation techniques, said layer having a thickness within the range of 500–2500 A., depositing a layer of a material selected from the group consisting of aluminum and silicon oxide upon said film-forming metal by condensation techniques, said layer having a thickness of the order of 200 A., anodizing the resultant structure, whereby there is produced an anodic oxide film and a layer of said material intermediate the said film-forming metal and said anodic oxide film, and depositing at least two terminals of a contact material upon the resultant assembly.

2. A method in accordance with the procedure of claim 1 wherein said oxide layer is aluminum oxide.

3. A method in accordance with the procedure of claim 1 wherein said film-forming metal is tantalum.

4. A resistor comprising a substrate material having deposited thereon successively a first layer comprising a film-forming metal selected from the group consisting of tantalum and niobium, a second layer comprising an oxide selected from the group consisting of aluminum oxide and silicon oxide, a third layer comprising an oxide selected from the group consisting of tantalum oxide and niobium oxide, and at least two terminals of a contact material.

References Cited

UNITED STATES PATENTS 3,159,566 12/1964 McLean et al. ________ 204—37
3,234,442 2/1966 Maissel et al. _______ 317—258
3,231,479 1/1966 Gorden et al. ________ 204—38
3,257,592 6/1966 Maissel ____________ 317—258
3,311,546 3/1967 Berry et al. __________ 204—42

JOHN H. MACK, Primary Examiner

W. B. VANSISE, Assistant Examiner

U.S. Cl. X.R.

29—610; 204—58